United States Patent
Freytag et al.

(10) Patent No.: US 10,261,143 B2
(45) Date of Patent: Apr. 16, 2019

(54) PROBEHEAD WITH ADJUSTABLE ANGLE FOR NMR-MAS APPARATUS

(71) Applicant: Bruker BioSpin AG, Faellanden (CH)

(72) Inventors: Nicolas Freytag, Binz (CH); Fabian Kuehler, Schwerzenbach (CH)

(73) Assignee: BRUKER BIOSPIN AG, Faellanden (CH)

( * ) Notice: Subject to any disclaimer, the term of this patent is extended or adjusted under 35 U.S.C. 154(b) by 161 days.

(21) Appl. No.: 15/355,290

(22) Filed: Nov. 18, 2016

(65) Prior Publication Data

US 2017/0146621 A1    May 25, 2017

(30) Foreign Application Priority Data

Nov. 20, 2015   (DE) .................. 10 2015 222 935

(51) Int. Cl.
*G01R 33/30*    (2006.01)
*G01R 33/46*    (2006.01)

(52) U.S. Cl.
CPC ....... *G01R 33/307* (2013.01); *G01R 33/4641* (2013.01)

(58) Field of Classification Search
CPC .. G01R 33/307; G01R 33/4641; G01R 33/30; G01R 33/46
USPC ........................................................ 324/307
See application file for complete search history.

(56) References Cited

U.S. PATENT DOCUMENTS

| 5,260,657 A | 11/1993 | Lewis et al. |
| 5,760,586 A * | 6/1998 | Foerster ............... G01R 33/307 324/318 |
| 5,872,452 A * | 2/1999 | Cory ................... G01R 33/307 324/318 |

(Continued)

FOREIGN PATENT DOCUMENTS

| JP | 2003329754 A | 11/2003 |
| JP | 200992424 A | 10/2010 |
| JP | 2011075472 A | 4/2011 |

OTHER PUBLICATIONS

Office Action in corresponding German Application No. 102015222935. 1, dated Aug. 11, 2016, along with a partial English translation.

(Continued)

*Primary Examiner* — Patrick Assouad
*Assistant Examiner* — Demetrius R Pretlow
(74) *Attorney, Agent, or Firm* — Edell, Shapiro & Finnan, LLC

(57) ABSTRACT

A probehead of an NMR-MAS apparatus includes a sample which has a rotation axis tilted by an angle $\theta > 0$ with respect to the z-axis. The angle $\theta$ can be adjusted about a target angle $\theta_{target}$ by tilting around a tilt axis. The rotation axis has a fixed angle with respect to the probehead, and the NMR-MAS apparatus tilts at least part of the probehead to adjust the angle $\theta$. The probehead has an outer contour K between an upper end and a lower end. For all z between the upper end and the lower end, a cross-section $S(z)$ of the contour K exists parallel to the xy-plane with a width $Q(z)$ in the x-direction. The width $Q(z)$ is smaller at points away from $z=0$, such that $Q(z1) < Q(0)$ and $Q(z2) < Q(0)$ for $z1 < 0$ and $z2 > 0$.

16 Claims, 5 Drawing Sheets

(56) References Cited

U.S. PATENT DOCUMENTS

| | | | |
|---|---|---|---|
| 6,118,274 A * | 9/2000 | Roffmann | G01R 33/34053 324/318 |
| 6,184,683 B1 * | 2/2001 | Emsley | G01R 33/4641 324/307 |
| 7,282,919 B2 | 10/2007 | Doty et al. | |
| 7,498,812 B2 | 3/2009 | Doty | |
| 7,535,224 B2 | 5/2009 | Hu et al. | |
| 8,203,339 B2 | 6/2012 | Johannessen et al. | |
| 8,547,099 B2 | 10/2013 | Takegoshi et al. | |
| 2003/0020474 A1 * | 1/2003 | Gerald, II | G01R 33/307 324/318 |
| 2004/0222796 A1 * | 11/2004 | Munson | G01R 33/307 324/322 |
| 2006/0152221 A1 | 7/2006 | Doty | |
| 2007/0273379 A1 * | 11/2007 | Hasegawa | G01R 33/34053 324/318 |
| 2008/0169814 A1 * | 7/2008 | Munson | G01R 33/307 324/321 |
| 2010/0106999 A1 * | 4/2010 | Hanif | H04L 41/0668 714/4.1 |
| 2010/0109666 A1 * | 5/2010 | Armbruster | G01R 33/307 324/318 |
| 2011/0018536 A1 | 1/2011 | Mullen | |
| 2011/0080171 A1 * | 4/2011 | Takegoshi | G01R 33/307 324/318 |
| 2013/0030749 A1 * | 1/2013 | Nishiyama | G01R 33/243 702/104 |
| 2013/0257432 A1 * | 10/2013 | Hu | G01R 33/307 324/322 |
| 2014/0099130 A1 | 4/2014 | Noheji | |
| 2014/0099730 A1 * | 4/2014 | Hu | G01R 33/307 436/173 |
| 2016/0111192 A1 * | 4/2016 | Suzara | H01F 6/06 335/301 |
| 2016/0245883 A1 * | 8/2016 | Munson | G01R 33/307 |
| 2018/0003782 A1 * | 1/2018 | Hassan | G01R 33/34007 |

OTHER PUBLICATIONS

Mamone, S. et al., "A hall effect angle detector for solid-state NMR", Journal of Magnetic Resonance, vol. 190, 2008, p. 135-141.

Mihaliuk, E. et al., "Optical lever for monitoring of the magic angle", Journal of Magnetic Resonance, vol. 223, 2012, p. 46-50.

Matsunaga, T. et al., "An Xo shim coil for precise magic-angle adjustment", Journal of Magnetic Resonance, vol. 256, 2015, p. 1-8.

* cited by examiner

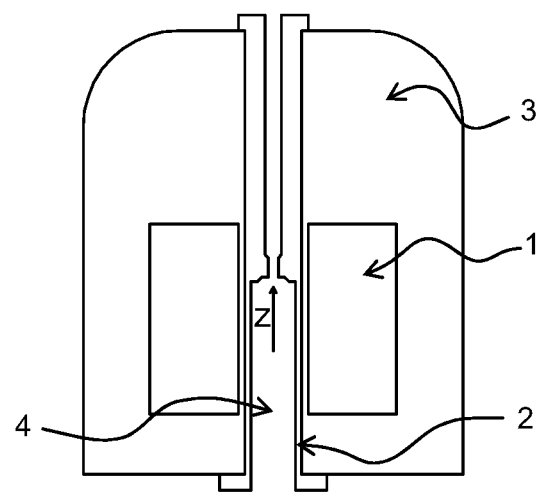
Fig. 5
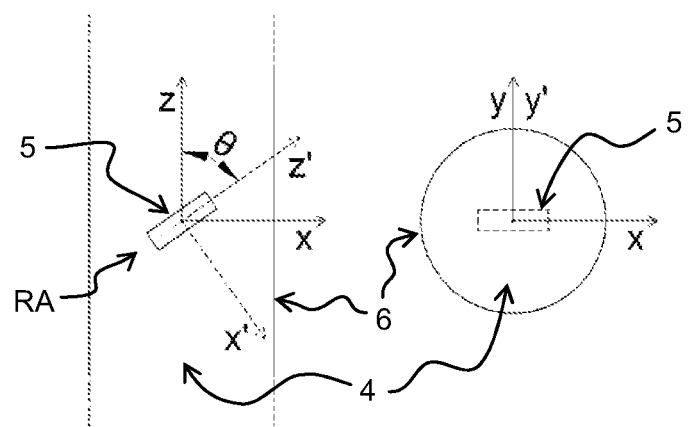
Fig. 6A  Fig. 6B

PROBEHEAD WITH ADJUSTABLE ANGLE FOR NMR-MAS APPARATUS

CROSS REFERENCE TO RELATED APPLICATIONS

This application claims foreign priority under 35 U.S.C. § 119(a) to German Patent Application No. 10 2015 222 935.1, filed on Nov. 20, 2015, the entire contents of which are hereby incorporated by reference.

FIELD OF THE INVENTION

The invention relates to a probehead for a Nuclear Magnetic Resonance—Magic Angle Spinning (NMR-MAS) apparatus in the cavity of a magnet system, which generates a homogeneous static magnetic field $B_0$ in a z-direction. A sample is in the probehead, and during the operation of the NMR-MAS apparatus, the sample rotates about a rotation axis that is tilted at an angle of $\theta > 0$ in relation to the z-axis and lies in an xz-plane. The angle $\theta$ can be adjusted by mechanical rotation about a tilt axis parallel to the x-axis within the interval of $\theta_{target} - \alpha 1 \leq \theta \leq \theta_{target} + \alpha 2$, i.e., the interval around a target angle of $\theta_{target}$, with the adjustment angles $\alpha 1$, $\alpha 2$. As described herein, z=0 is defined as the intersection point of the rotation axis with the z-axis at the adjusted angle $\theta = \theta_{target}$.

An example of such an NMR-MAS probehead is described in U.S. Pat. No. 7,498,812 B2.

BACKGROUND

NMR spectroscopy is a method of instrumental analysis, which can determine the chemical composition of samples. Radio frequency (RF) pulses are emitted into the sample, which is located in a strong, homogeneous, static magnetic field $B_0$, and the electromagnetic reaction of the probe is measured. With solid state NMR spectroscopy, the technique of magic angle spinning (MAS) is used to reduce line broadening due to anisotropic interactions of the sample. In NMR-MAS the sample is tilted to the so-called "magic angle" of $\theta_m = \arccos(\sqrt{1/3}) \approx 54.74°$ with respect to the homogenous, static magnetic field. The angle $\theta_m$ is a solution of the second order of Legendre polynomials $P_2(\cos(\theta_m))=0$, so that all interactions dependent on this Legendre polynomial disappear at this angle to the magnetic field. This is the case for three important interactions in solids: dipolar coupling, chemical shift anisotropy and quadrupole interaction of the first order. For polycrystalline measurement samples, the crystal directions of the individual crystals are randomly oriented with respect to the static field The elimination of the interactions is achieved by a sufficiently fast rotation of the measurement sample at the magic angle. In this way, line broadening due to these interactions can be significantly reduced, ideally even to the natural line width.

NMR-MAS probeheads allow high resolution NMR spectroscopy to be carried out with solid, powder, or semi-solid (e.g., gel or paste) measurement samples. The measurement sample is poured into a circular cylinder sample holder, also called the rotor, which is rotated at very high speeds (e.g., with a rotation frequency in the range of a few kHz to over a hundred kHz) via compressed gases in a stator. The radial position is secured by air bearings in the stator, while the holding force created by the air flow holds the rotor in its axial position in the stator.

In general these probeheads are used in superconducting NMR magnet systems, in which the homogeneous static magnetic field $B_0$ is oriented along a "bore hole," which specifies the z-axis of the laboratory coordinate system. Such a magnet system is illustrated in FIG. 5. In general, the magnet system comprises a magnet and at least one shim system. The magnet normally includes a dewar/vacuum isolation, radiation shields, at least one magnet coil and safety elements. In general, the magnet coil is laid out in such a way that it is actively shielded to/from the outside environment, in order to minimize any influence of susceptibility changes in the direct environment of the magnet on its field. The shim system is frequently designed in two parts, and includes a cryogenically cooled part made of superconductive wire inside the dewar, and a room temperature shim system, which is arranged inside the bore hole of the dewar. The magnet system includes a cavity into which the NMR probehead is inserted during a measurement. In general, this cavity is substantially tubular in sections, but it can also contain conical sections, which may serve as centering devices for probeheads, samples etc.

In FIGS. 6A and 6B, the sample 5, the rotation axis RA and the walls of the cavity 6 are shown in two orthogonal sections. Further elements of the NMR probehead, such as RF coils, stator, walls, networks etc., are not shown for the sake of simplicity. The rotation axis RA of the sample is also described as the z'-axis, and has a joint origin with the z-axis. The z- and z'-axes lie on a plane defined by the x- and z-axes, as well as the x'- and z'-axes. The y- and y'-axes of the two coordinate systems are identical.

For many NMR experiments in magnet systems with $B_0$ fields in the range from 7 T to 25 T, an adjustment precision of the magic angle from 0.1° to 0.01° is sufficient. However, for some applications (e.g., satellite transition (ST-MAS) NMR) a precision of up to 0.001° is required. The angle adjustment should remain constant over a wide range of temperatures, and be reproducible when changing samples.

In the prior art, with most MAS probeheads, the angle adjustment is carried out by a mechanism integrated into the probehead (e.g., as described in U.S. Pat. No. 7,498,812 B2, US 2014/0099730 A1, U.S. Pat. Nos. 7,535,224 B2, or 5,260,657), as shown schematically in FIG. 8. Various methods such as using hoists with end stops, rods and levers, gear wheels, spindles, etc., are common. These methods are also in use for hermetically sealed probeheads, where the temperatures of sample and detection coil may differ significantly, and are carried out with bellows or O-ring seals (e.g., as described in U.S. Pat. No. 7,282,919 B2) for the sealed probeheads.

The extremely high requirements for the precision and reproducibility of the mechanism present a technological challenge to integrating the angle adjustment into the probehead. Assuming typical lever lengths in the range from approximately 2 cm to 3 cm, the required angular precision results in a mechanical tolerance of approximately 0.5 μm to 5 μm. Such narrow tolerances lead to high manufacturing costs for the mechanical components.

MAS probeheads typically cover a very wide temperature range for the samples. Probeheads designed for the lower end of the temperature scale may be intended specifically for temperatures down to −50° C., −80° C., −130° C., or temperatures in the cryogenic realm from 30 K to 100 K. Probeheads may also be designed for the upper limit values of temperature control (e.g., temperatures up to +80° C., +150° C., or far higher in the case of special samples). The temperature control of the samples is ensured by a temperature control gas in most cases, which may also control the temperature of the bearing air and/or the drive air.

Due to the compactness of the construction (the sample diameters are typically in the range from 0.7 mm to 4 mm), the temperature of at least part of the tilt mechanism is close to the temperature of the samples. The reproducibility of the adjustment of an angle with high precision and over a wide range of temperatures, is technically extremely difficult to implement, and leads to high costs in the manufacturing of the mechanical parts.

Furthermore, an NMR system may include a probehead without internal adjustment (e.g., as described in U.S. Pat. No. 8,547,099 B2). With this NMR system, the tilt of the rotation axis (z'-axis) with respect to the probehead and the magnet system is kept constant, and the direction of the static magnetic field is rotated by generating a field $B_1$ with an additional electromagnetic coil. The additional electromagnetic coil is arranged around the sample, so that the angle between the z'-axis and the direction of the linear combination of $B_0$ and $B_1$ fields, corresponds to the magic angle.

Although this method enables the fast and precise adjustment of the angle, introducing an additional electromagnetic coil into the magnetic system produces a disadvantage in that the diameter of the probehead must be reduced in the area around the sample. Furthermore, the adjustment range is limited to very small angle corrections in the range of less than 0.05° (see reference [8]) due to the dissipation in the additional coil generated in operation.

Reducing the outer diameter of a probehead that has an internal adjustment mechanism leads to various disadvantages:

- The space available for the technical realization of the sample rotation (e.g., air bearings, drive, gas pipes, etc.) decreases. This increases the complexity and generates additional costs.
- The space available for the RF fields within an electrical shield decreases, leading to reduced RF performance of the probeheads. This is expressed in reduced signal-to-noise ratio of the measurement, as well as increased performance requirements and accompanying higher dissipation needed to achieve the pulse durations.
- The available space for gas pipes, the RF network, optional heat exchangers, pump lines, and adjustable RF elements is reduced. This can have a negative influence on the performance of various components of the probehead.

For this reason, the reduction of the probehead diameter should be as small as possible, at least in the central area.

Two types of magnet systems exist on the market: standard bore (SB) magnet systems and wide bore (WB) magnet systems. These magnet systems have bore holes with a diameter $D_B$ of around $D_B$=40 mm+/−2 mm for SB systems and $D_B$=73 mm+/−2 mm for WB systems.

For SB magnet systems, diameter reductions of more than 10 mm are typically unacceptable for the performance of samples. For many applications, a 5 mm diameter reduction is already harmful. As a sufficiently powerful additional electromagnetic coil for angle correction cannot be produced in this reduced volume, a purely electrical adjustment of the magic angle for SB probeheads, particularly for ultra high field NMR with magnetic field strengths $B_0$>20 T, is not realistic.

To provide context for better understanding the improvements associated with the present invention, a typical NMR-MAS probehead known from the prior art will first be described In the prior art, MAS probeheads generally include an adjustment mechanism, which enables the angle θ between the rotation axis of the sample along z and the static magnetic field $B_0$ along z to be precisely adjusted within the range $\theta_{target}-\alpha 1 \leq \theta \leq \theta_{target}+\alpha 1$. Such an adjustment mechanism integrated into the probehead is described as an "internal" or "integrated" mechanism. In this mechanism, in general, the stator, containing the sample, the bearing and the drive of the rotor and the RF coils are moving. This movement is induced by hoists, spindles and gearwheels, levers with linear movements or similar mechanisms, and predominantly takes the form of rotation movement, although rotation movements combined with linear movements are also common. Adjustment mechanisms provided with manual and motorized adjustment are known, particularly provided with electromotive adjustment. With many prior art probeheads, particularly those that can be used in SB magnet systems, the angle adjustment can be carried out over a very large range, which enhances the ease with which the samples can be exchanged.

It is known that particularly when the sample temperature changes, these adjustment mechanisms are often not sufficiently precise in the context of demanding NMR measurements. This particularly applies to proton spectroscopy and STMAS, where angle errors in the range of just a few thousandths of a degree can lead to noticeable line broadenings in the measured spectra. An additional problem occurs with probeheads with cryogenically cooled detection coils. In general, the coils are separated from the samples by an insulation vacuum. To this end, there is usually at least one wall of a Dewar between the detection coils and the sample. It is mechanically very onerous to integrate tilting of samples, the dewars, and the RF coils within a probehead, (although this was in fact the method disclosed in U.S. Pat. No. 7,282,919 B2 in the context of WB probeheads.

In the prior art, the following method is used to adjust the angle of θ between the rotation axis of the sample and the magnetic field direction: in general, a sample (e.g. powdered potassium bromide) with the greatest possible dependency of the line width on the adjusted angle is measured using the NMR probehead, and the line widths of the central line, and rotation side bands and/or the height of the lines and/or the ratio of amplitude/width between various lines are evaluated. Alternatively, an evaluation can be carried out directly on the time domain signal. In this method, the angle is adjusted by activation of an adjustment mechanism, which tilts the stator relative to the z-axis, around a tilt axis. Since the stator specifies the rotation axis, the rotation axis is rotated against the z-axis around the tilt axis. The tilt axis is mounted against the probehead, which does not change its position in the magnet system.

In general, prior art probeheads have a contour which consists of a cylindrical pipe with a substantially constant outer diameter.

Often, these probeheads also have options for centering and positioning against the magnet system (generally in the area of the upper and lower end of the part of the probehead inserted in the cavity), in order to achieve the clearest possible defined positioning, when the probehead is installed in the magnet system. In this manner, the probeheads can use the maximum available volume of an ordinarily circular cylindrical cavity of the magnet system as efficiently as possible.

SUMMARY

The invention described herein provides an NMR-MAS probehead, which makes it possible to adjust the angle θ over a large range with high precision and reproducibility.

The NMR-MAS probehead described herein can be produced cheaply with readily available technology and equipment, without significantly affecting the performance of the probehead.

BRIEF DESCRIPTION

The invention is illustrated in the drawing, and is explained in more detail using design examples. This is shown by:

FIG. 5 illustrates a prior art magnet system, including a magnet and at least one shim system.

FIGS. 6A and 6B illustrate the boundary of the cavity and a sample with its rotation axis, including the xyz- and x'y'z'-coordinate systems in a prior art magnet system.

DETAILED DESCRIPTION

The invention described herein relates to a new design of the probehead in a NMR-MAS-spectrometer. The probehead includes an outer contour that allows at least the part of the probehead inserted into the cavity of the magnet system to be tilted against the magnet system in the range $\theta_{target}-\alpha1 \leq \theta \leq \theta_{target}+\alpha2$. The probehead also includes an adjustment mechanism that defines the position and angle of the probehead with respect to the magnet system. The outer contour includes at least one cross-section parallel to the xy-plane, with a width Q(z) smaller than the width Q(0) of the cross-section of the probehead with the xy-plane at z=0.

The techniques presented herein provide a surprisingly simple and effective way to adjust the rotation axis of a sample in a NMR-MAS-probehead. The rotation axis has an unchangeable, fixed angle position with respect to the probehead, and the NMR-MAS-apparatus has an adjustment mechanism, which allows at least the part of the probehead inserted into the cavity to be adjusted at an angle α with $-\alpha1 \leq \alpha \leq \alpha2$ with respect to the z-axis, by mechanically tilting around a tilt axis. The cavity of the magnetic system is an expanded body, which is described by a set M of space points. A set N includes all partial sets O(α) in which the partial sets O(α) are described by tilting the points generated from the set M about the tilt axis by the angle α within the range $-\alpha1 \leq \alpha \leq \alpha2$. A set P=∩N is the intersection of all points generated by tilting the probehead at an angle α with $-\alpha1 \leq \alpha \leq \alpha2$ with the cavity of the magnetic system. The probehead has an outer contour K, which has an upper end at z=L1 and a lower end at z=−L2, and K is a partial set of P: K⊂P. For all z in the range of −L2≤z≤L1, an intersection S(z) of the contour K exists parallel to the xy-plane, The intersection S(0) shows the width of Q(0) in the x-direction. At least one intersection S(z1) exists with z1<0 with a width Q(z1) in the x-direction, whereby Q(z1)<Q(0). Additionally, at least one intersection S(z2) exists with z2>0 with a width Q(z2) in the x-direction, whereby Q(z2)<Q(0).

Figure 1:
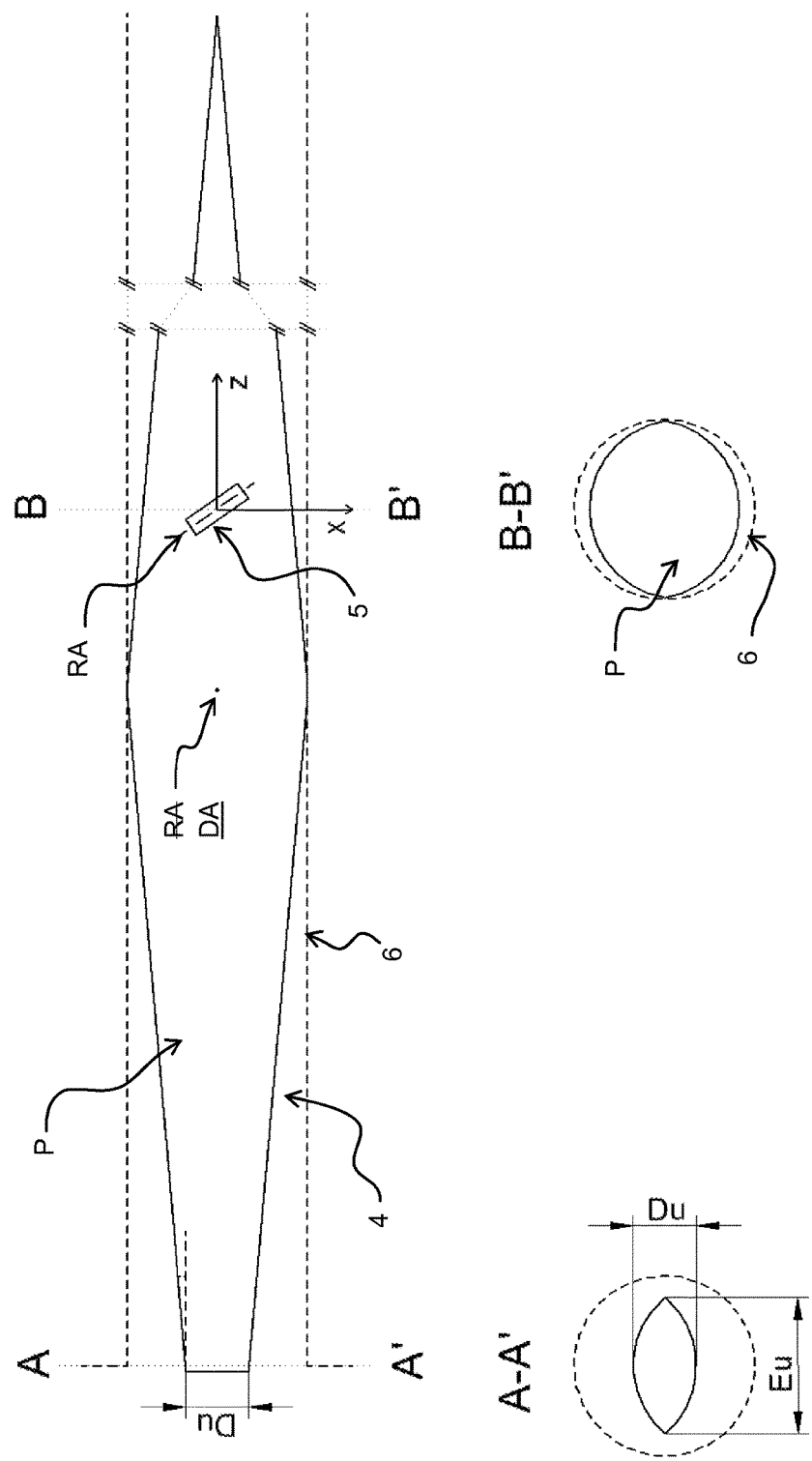
FIG. 1 illustrates a cross-section T through the cavity 4 of a magnetic system parallel to the xz-plane, and two cross-sections parallel to the yz-plane.

FIG. 1 shows an example in which the cavity 4 of the magnet system comprises a continuously circular cylindrical bore hole, and the cross-section with the xz-plane is shown. The cross-sections A-A' and B-B' are parallel to the xy-plane.

The boundary of the cavity 4 is shown with dotted lines in FIG. 1, whereas the boundary of the set P of points within the cavity when tilted about an angle α within the range $-\alpha1 \leq \alpha \leq \alpha2$ is shown with solid lines. Sample 5, the rotation axis RA, and the tilt axis DA are also shown. The point where the rotation axis RA intersects with the z-axis defines the origin of the coordinate system used herein. In this particular example, the maximum negative adjustment angle α1 and positive adjustment angle α2 are identical (i.e., α1=α2).

As described herein, a probehead for NMR-MAS-spectroscopy is provided, which enables the angle of the rotation axis of a sample against the static homogeneous magnetic field $B_0$ to be adjusted with high precision and reproducibility. At the same time, the techniques presented herein provide the largest possible volume within the probehead, allowing space for electromagnetic, pneumatic, and/or mechanical components.

In contrast to the prior art, the system described herein places the adjustment mechanism outside of the probehead, instead of inside the probehead, to guarantee the standards for high precision and reproducibility of the angle adjustment. The probehead is tilted in its entirety against the static field $B_0$, at least the part which is inserted in the magnetic bore hole (i.e. the cavity in the magnetic system). By adjusting the probehead, the dimensions of the mechanism for the angle adjustment can be designed much larger than for the case of an internal mechanism. The lever arm ratios become an advantage, significantly decreasing the costs for mechanisms with sufficient precision as a result. Typically, the distance between the tilt axis and an attachment point for the adjustment mechanism outside of the bore hole of the magnet system are in the range of half a meter to a meter, so that the requirements for the precision of the adjustment mechanism are approximately 10-200 μm. Furthermore, the casing of the probehead and components outside the probehead can be significantly better insulated against a temperature change of the samples, reducing the requirements for temperature compensation of the adjustment mechanism.

For particularly high precision and/or reproducibility requirements, the temperatures within the cavity of the magnet system and/or the temperature of the ambient air surrounding the NMR system can be regulated. Such a temperature regulation combined with good insulation of the sample, along with the gas flows against the probehead's cover necessary for MAS operation, minimize the requirements for matching thermal expansion coefficients of the materials used in the adjustment mechanism. Furthermore, the use of sensors to adjust the angle is known in the prior art, e.g., Hall sensors (see references [7, 9]), optical sensors, (Reference [10]) and/or tilt sensors.

In the prior art, probeheads generally have a circular cylindrical outer contour. These can be made particularly cheaply from a pipe. For probeheads with a constant outer diameter, rotating the probehead by an angle θ with respect to the magnet system, then the outer diameter of the probehead must be reduced significantly to achieve the necessary rotation range for the sample without colliding with the bore hole of the magnet system. The lowest reduction of the outer diameter is achieved for the case in which the tilt axis is half way between the lower end of the magnet system pipe and the upper end of the probehead. One disadvantage in this arrangement is that the tilt point is not at z=0, and the sample moves laterally (i.e. in the x-direction) as well as axially (i.e. in the z-direction) in relation to the magnets, to correct the tilt angle. A shim correction may then be necessary in order to reproduce the required field homogeneity. Furthermore, the sample can be swiveled out of the most homogeneous area of a magnet, at least at one of the two ends of the sample, worsening the achievable NMR line widths.

Figure 7:
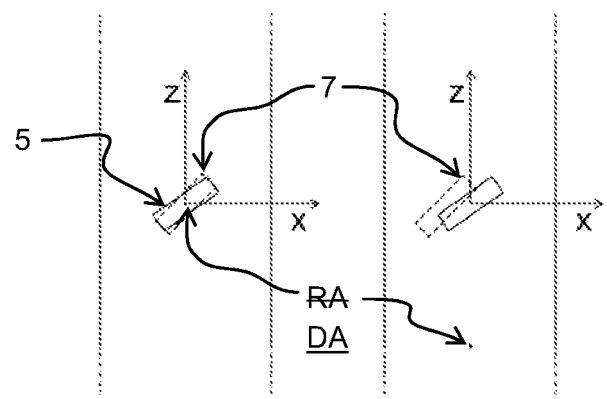
FIG. 7 illustrates the movement of a sample while tilting the tilt axis positioned in the center of the sample (left) and the tilt axis positioned outside of the center of the sample (right).
Figure 8:
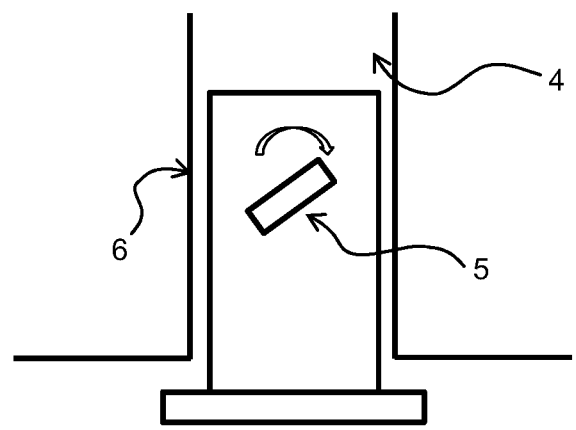
FIG. 8 illustrates a prior art magnet system with probehead, where the adjustment of the angle of the rotation axis of the sample with respect to the z-axis is carried out by a mechanism integrated into the probehead.

This is illustrated in FIG. 7: the sample 5 in its original position is illustrated by the solid lines and the tilted sample 7 is illustrated by the dotted line. When the sample is tilted around the tilt axis DA, at an angle of α, the sample is hardly moved in the x– and z–direction when the tilt axis DA is at z =0 (shown on the left). When the tilt axis DA is at z ≠0 (shown on the right) the sample is displaced from the origin, which leads to a movement of the center of the sample in the x– and z direction.

However, if the tilt axis is arranged in the center of the sample to avoid the aforementioned problems, then the possible outer diameter of the probehead casing is significantly reduced. The width of the probehead above the zero point L1 is typically significantly smaller than the width –L2 underneath the zero point of the coordinate system.

Typically, the angle α is required to be adjusted by +/−1°, but at least by +/−0.5°. This leads to a distance between the tilt axis DA and the upper or lower end of the probehead of 0.5 m to 1 m, with a lateral deviation of the probehead in the range from 4.5 mm to 17.5 mm, and therefore a reduction in the outer diameter from 9 mm to 35 mm.

While the outer diameter of a SB system has to be reduced by more than a fifth in the best case scenario (and up to nine tenths in the worst case), the reduction for a WB system can be in the area of one tenth to a quarter of the outer diameter. From this, it becomes clear that the aforementioned technical disadvantages, which arise due to a globally reduced outer diameter, are only tolerable for WB systems or very compact (short) SB systems with low requirements for the achievable adjustment range. Particularly for SB systems with magnet systems with high field strengths, which are typically significantly less compact, this leads to unacceptable compromises in the performance of the probeheads.

The magnet system comprises at least one magnet and at least one shim system, and produces a homogeneous static magnetic field $B_0$, which is parallel to a z-axis. Generally, the magnet system has a substantially cylindrical cavity 4 with a cylindrical axis, at least in a central section, which coincides with the z-axis of a coordinate system. The cavity has at least one opening, which serves to introduce a probehead into the magnet system. According to the definitions used herein, this opening should be on the lower end (z<0) of the magnet system, regardless of the polarity of the magnetic field $B_0$. In general, the cavity can be approximated in sections through cylindrical, conical and spherical sections. A section should be understood as a part of the whole: section by section, circular cylindrical shapes including an arbitrary number of partial parts of a circular cylinder. In particular, cavity sections along the z-axis have circular cross-sections with the xy-plane.

The probehead is intended to accept a sample in a circular cylindrical shaped sample holder that has a rotation axis RA. The probehead is fitted with technical equipment (e.g., bearings and drive) to allow the sample holder to rotate about its rotation axis. This rotation reaches frequencies greater than 1 kHz, in particular greater than 10 kHz. Ideally, the rotation frequencies are designed in such a way that the speed ν of the rotor surface is in the range 0.7 $v_{sound} < v < v_{sound}$, where $v_{sound}$ is the speed of sound in the media surrounding the rotor at the conditions in the vicinity of the rotor (e.g., pressure, temperature, etc.). This medium is ideally a gas, preferably air, nitrogen or helium with a pressure in the range of $10^{-4}$ hPa to $10^4$ hPa.

The rotation axis of the sample holder lies on the xz-plane and is tilted at an angle of θ>0, in relation to the z-axis. The probehead and/or the NMR system comprising the magnet system, the probehead, and a probehead holder, include a device, which serves to orient the sample at a target angle of $θ_{target}$ in relation to the z-axis. This device defines a tilt axis DA, which is as parallel as possible to the y-axis. The intersection point of the rotation axis of the sample with the z-axis, an adjusted angle of $θ_{target}$, defines z=0.

The tilt axis may intersect with the xz-plane at x,z=0, but may also intersect at positive or negative values of x and/or z.

Ideally, the tilt axis intersects the rotation axis in a central area of the sample. Alternatively, the tilt axis can intersect the xz-plane at x≠0 or z≠0.

The NMR system allows the angle θ to be changed in the interval $θ_{target}$−α1≤θ≤$θ_{target}$+α2. The maximum negative adjustment angle α1 and the maximum positive adjustment angle α2 can be identical, but in general are different. It is also possible, that one of the two adjustment angles is zero, i.e., α1=0 and/or α2=0.

In operation, the probehead is introduced into the cavity of the magnet system at a lower end at z=−L2. In operation and at an oriented angle θ=$θ_{target}$, the upper end of the probehead is at z=L1.

The cavity of the magnet system is an expanded body, which is defined by a set M of points in space. The set M includes all points that are contained in the cavity of the magnet system.

The bodies described by the set M can be rotated around the tilt axis at an adjustment angle α in the range of α1≤α≤α2. The resulting bodies are described by the sets O(α).

The set N comprises all subsets O(α), i.e. all bodies that arise from the set M that are tilted around the tilt axis by the angle α within the range −α1≤α≤α2. The intersection P=∩N of all bodies generated from the cavity of the magnet system by tilting at an angle α with −α1≤α≤α2 describes the possible configurations for tilting the probehead at the angle α within the range −α1≤α≤α2 without colliding with the magnet system.

The probehead has an outer contour K, which has an upper end at z=L1 and a lower end at z=−L2. Components of the probehead, which are outside of the cavity in operation, are not described by the contour K. In other words, the contour K is simply a subset of the surface of the probehead. Furthermore, the contour K is a subset of P: K⊂P, in particular K is a proper subset of P.

For all z in the range −L2≤z≤L1, there is a cross-section S(z) of the contour K that is parallel to the xy-plane. This cross-section has a width in the x-direction, which is defined by Q(z) and a width in the y-direction, which is defined by R(z).

In one example of preferred design shapes of the probehead presented herein, which provides noticeable advantages, the angle of $\theta_{target}$ is the value of the magic angle $\theta_{target}$=arccos $(3^{-0.5})=\theta_m$ in relation to the z-axis. In this example, it is particularly advantageous for the adjustment of the angle $\theta$ within the range $\theta_m - \alpha 1 \leq \theta \leq \theta_m + \alpha 2$ to have a precision and reproducibility of at least 0.025°, or better yet 0.01°, or even ideally 0.001°. Additionally, the adjustment angles $\alpha 1$, $\alpha 2$ should fall in the range $0° \leq \alpha 1$, $\alpha 2 \leq 2°$, at least $\leq 1°$, but at least $\leq 0.5°$. Such a probehead may be used for magic angle spinning NMR.

In practice, cylindrical shaped design shapes of sections of the contour K may prove to be particularly useful, in particular circular hollow cylinder shaped sections. These are particularly easy to build mechanically, as the cylindrical sections can be manufactured from drawn profiles, pipes or turned parts. In one example embodiment, at least one of the hollow cylinder sections is a circular cylinder, as this further facilitates manufacturability of the section. Circular cylindrical sections are particularly advantageous, as they are designed in such a way that every intersection with the xy-plane is substantially circular. Sections designed in this way can be manufactured from pieces of pipe cut to length without reshaping. In the case of circular cross sections, a seal can be achieved particularly easily, e.g., with an O-ring or a screw connection. Furthermore, a probehead whose contour K primarily comprises four, even better three, or ideally just two hollow cylindrical sections is preferred. These embodiments significantly ease construction effort and reduce costs.

Figure 2:
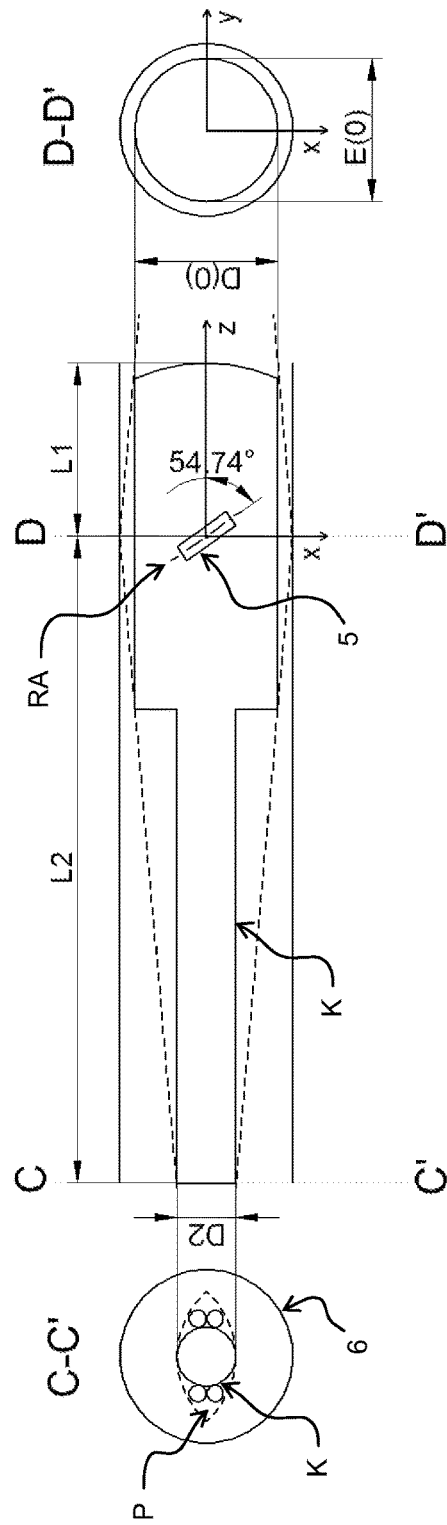
FIG. 2 illustrates an example embodiment of the probehead, with sections of circular cylindrical contour K, illustrated in a cross-section T parallel to the xz-plane and in the cross-sections S(−L2) and S(0) parallel to the yz-plane.

FIG. 2 illustrates a probehead according to one embodiment. The contour K of the probehead and the boundary of the cavity 4 are illustrated as solid lines, whereas the boundary of the set P is illustrated with dotted lines. In the area of the sample, the contour comprises an outer surface of a circular cylinder, with the diameter D(0)=E(0). In this design shape, this area is designed symmetrically to the rotation axis and z=0. In general, this section may not be symmetrical about the tilt axis or the origin of the coordinate system. In a lower area, the contour K of the probehead comprises a plurality of hollow circular cylinder sections. The central circular cylinder with the diameter D2, may serve as a loadbearing element, whereas the smaller circular cylinders may illustrate gas tubes and cables.

Furthermore, in some embodiments of the probehead described herein, the contour K of the probehead is designed in such a way that a cross-section T with the xz-plane, includes a straight line for at least one section at the angle $+\alpha 1$, $-\alpha 1$, $+\alpha 2$ or $-\alpha 2$. These embodiments may maximize the volume available for the probehead.

Figure 3:
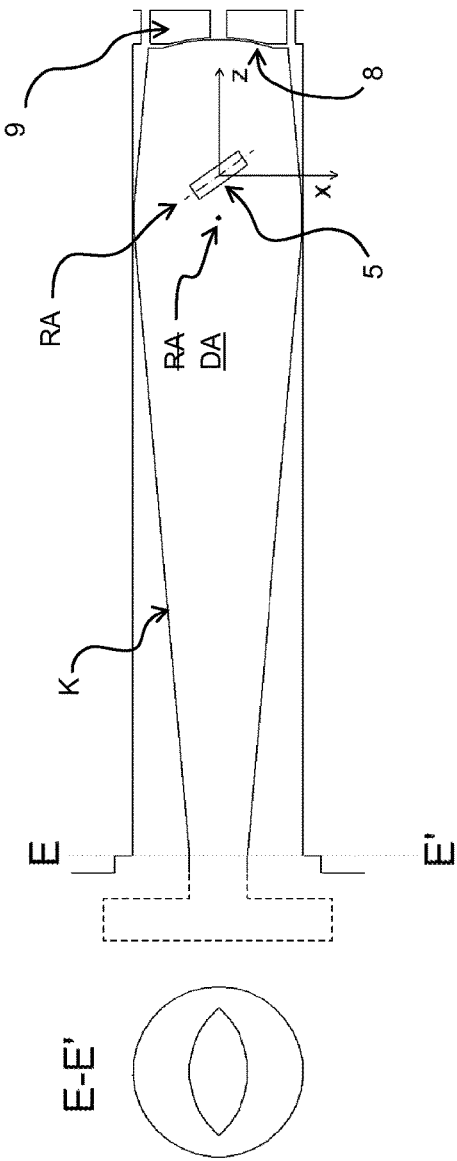
FIG. 3 illustrates an example embodiment of the probehead, where the contour K matches the boundary of cross-section P and cross-section T, at least in sections.

Additional design forms of the invention include the contour K being designed in such a way that, at least for the cross-section T, all points of the intersection P are all located within or on the contour K as the points generated from the cavity of the magnet system tilt at an angle of a within the range $-\alpha 1 \leq \alpha \leq \alpha 2$. These embodiments may provide the largest possible volumes in the corresponding section. Such a probehead is illustrated in FIG. 3 as a cross-section along the xz plane. In FIG. 3, the contour K and the boundary of the cavity 4 are illustrated as solid lines. The part of the probehead that is located outside of the cavity is illustrated by dotted lines. In this example, the cavity does not represent a continuous bore hole.

In some design forms of the probehead described herein, the contour K of the probehead is made up of sections of hollow cylindrical and/or spherical surfaces. These forms maximize the adjustment path and at the same time are easy to manufacture.

Figure 4:
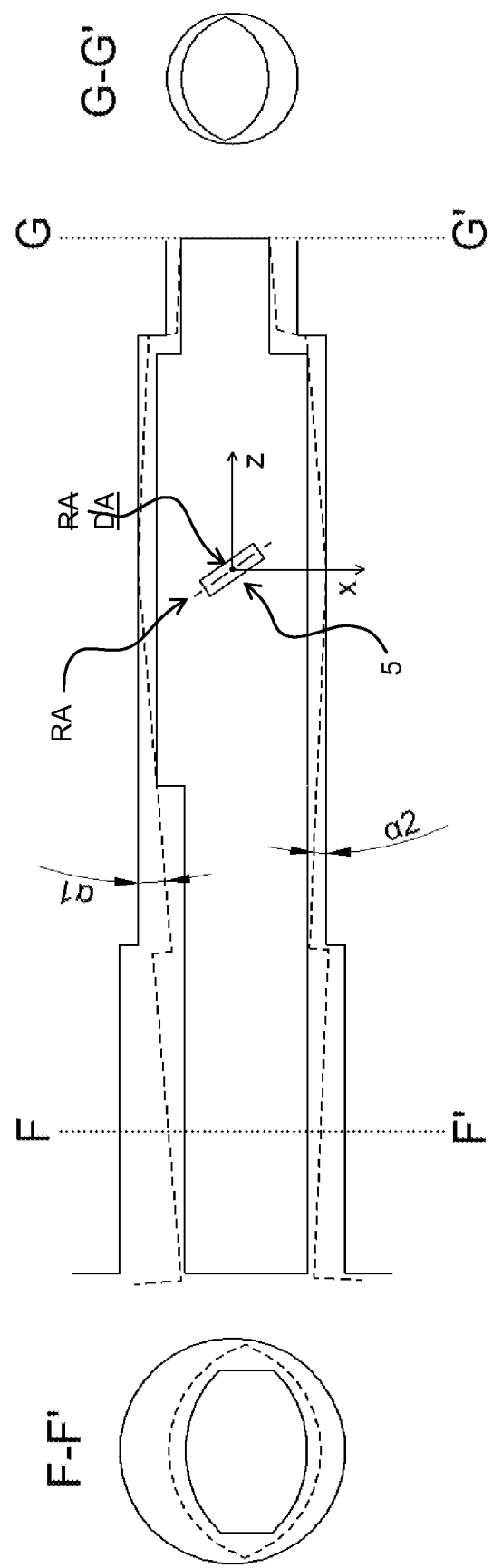
FIG. 4 illustrates an example embodiment showing a general design of the cavity and adjustment angles of α1≠α2, showing a cross-section of the probehead, which contains at least two sections that are straight lines parallel to the x-axis for at least one z-value.

A further design form of particularly easily constructed and compact embodiments includes a cross-section S(z) of contour K of the probehead with a plane parallel to the xy-plane. The cross-section S(z) includes, for at least one z-value, at least two sections that extend as straight lines parallel to the x-axis. This has the advantage that space remains available next to the probehead inside the cavity for other uses, e.g., laying cables or optical fibers. Such an embodiment is illustrated in FIG. 4 in cross-section F-F'.

For some designs of the NMR-MAS probehead, with a lower width of Qu=Q(-L2) (i.e., the width in the x-direction of the cross-section S(-L2)) and/or an upper width Qo=Q(L1) (i.e., the width of the cross-section S(L1)) the following applies:

$Qu \leq Q(z) \forall z > -L\,2$ and $\exists z$ for which $Qu < Q(z)$ applies and/or $Qo \leq Q(z) \forall z$ with $0 < z < L\,1$ and $\exists z$ with $-L\,2 < z < L\,1$ for which $Qo < Q(z)$ applies and/or $Qu < Q(0)$ and $Qo \leq Q(0)$.

In these examples, it may be particularly advantageous if Qu is 10-20% smaller than Q(0). It may also be particularly advantageous if Qu is at least 10-20%, and/or 5-10 mm, or ideally 3 mm smaller than the dimension in the x-direction of the intersection of P with the xy-plane. This enables a particularly large range of the adjustment angle, with a tilt axis near the origin.

In preferred, real-world examples, the width of the contour K at the origin is 35-45 mm, i.e., 35 mm$\leq Q(0) \leq$45 mm.

Such probeheads can be operated in SB magnet systems, which can be manufactured with significantly higher field strengths, with lower costs than WB systems, and exist in much larger numbers on the market.

In another example, the adjustment mechanism includes a bearing 8 within the cavity of the magnet system. The adjustment mechanism may include a mechanism that clamps the probehead against the bearing 8. The adjustment mechanism may also include an adjustable spacer at the lower end of the probehead.

In this way, tolerances due to movements of the probehead relative to the bearing can be minimized. Furthermore, including an adjustable spacer in the adjustment mechanism at the lower end of the probehead serves to define the tilt of the probehead against the magnet system. Such a spacer may be motorized to automate the adjustment of the tilt angle. This example reduces requirements on the mechanical precision. In addition, the motor may be located outside of the cavity of the magnetic system, so that the static residual fields are significantly reduced, and classic electric motors may be used instead of piezo drives.

These embodiments allow a reproducible placement of the probehead into the magnet system, and a reproducible adjustment of the angle. In combination with a measurement of the adjustment angle, the probehead described herein allows the regulation and/or tracking of the adjustment angle to account for thermal variations.

In some example embodiments, the bearing 8 includes a bearing part 9 integrated with the magnetic system. The bearing may also include an at least partially spherical connection of the probehead at the upper end or an at least partially cylindrical connection of the probehead at the upper end with cylinder axis parallel to the y-axis. Such a probehead is illustrated in FIG. 3.

A spherical connection may be mated with a bowl, a cone, or a differently designed bearing 9, to produce an upper bearing. In one example, the center point of the sphere coincides with the origin of the coordinate system. In this example, the tilt axis is in the center of the sample. If the probe head is tensioned against this bearing, the probehead can be reproducibly positioned in the magnet system. If the mechanism for angle adjustment is affixed to the lower end of the probehead, the lever arm is large enough that micrometric precision is no longer required to achieve sufficient angle tolerances and reproducibility. This reduces the costs for the angle adjustment mechanism.

Other examples include a connection in the form of a cylinder with its cylinder axis parallel to the y-axis. In this way, the probehead may be guided into a matching concave cylindrical mechanism. The tilt axis is clearly defined and the probehead is prevented from tilting around an axis orthogonal to the rotation axis. Ideally, the cylinder axis coincides with the y-axis. This simplifies the construction of the adjustment mechanism.

In a further example, the bearing may be formed by a mechanical axle that is mounted on a pivot in the cavity of the magnet system, and forms the tilt axis of the probehead. The matching bearing may be seen as part of the magnet system, and not the probehead (e.g., if it is firmly connected to the probehead and is only put into operation in the magnet system). This may also apply for matching bearings for the spherical or roller bearings described herein. The matching bearings may be located outside of the intersection of all bodies generated from the cavity of the magnet system, through tilt with an angle of a with $-\alpha1 \leq \alpha \leq \alpha2$ around a rotation axis, as the matching bearings remain rigid during the rotation of the probehead. A connection of rigid and flexible elements of the probehead (e.g., through bellows) may also be seen as part of the magnet system and not the probehead, and/or the contour of the probehead in the cavity.

The lower end of the probehead may be moved against the magnet system using an adjustable spacer. The combination of linear movement and a tilt axis near the origin of the coordinate system significantly reduces the tolerance requirements for the adjustment mechanism. This reduces the costs of manufacturing the total system.

Preferably, for the examples described herein, the adjustment mechanism may have a rocker attached underneath the magnet system. The lower end of the probehead may be moved against the magnet system using an adjustable spacer. The combination of linear movement and a tilt axis near the origin of the coordinate system significantly reduces the tolerance requirements for the adjustment mechanism. This reduces the costs of manufacturing the total system.

As described herein, the problems of MAS probeheads in the prior art are addressed by providing an NMR system designed such that it includes a probehead with an outer contour that allows the NMR system to tilt and/or revolve at least the part of the probehead inserted in the cavity of the magnet system. The NMR system also includes an adjustment mechanism that defines the position and the angle of the probehead with respect to the magnet system. The rotation axis of the sample in a probehead, as described herein, shows a fixed angular position with respect to the probehead, at least during the adjustment of the angle between rotation axis and z-axis. The contour K of the probehead that lies within the cavity of the magnet system includes at least one cross-section $S(z1)$ parallel to the xy-plane, with $z1<0$, whose width $Q(z1)$ is smaller than the width $Q(0)$ of the cross-section of the probehead with the xy-plane at $z=0$. The contour K also includes at least one cross-section $S(z2)$ with $z2>0$ and with a width $Q(z2)$ in the x-direction, whereby $Q(z2)<Q(0)$.

Compared to a tubular probehead of constant diameter without an integrated adjustment mechanism, a probehead designed as described herein can be tilted over a significantly larger adjustment range with respect to the magnet system. Lengthening the lever arm when tilting the probehead with respect to the magnet system significantly reduces the requirements on the mechanical precision. In addition, it is significantly easier to keep the outer shell of the probehead and the shim system contained in the magnet system at a constant temperature, than it is to control the thermal expansions of an integrated adjustment mechanism when changing the temperature of the samples. In this way, the probehead described herein increases the precision and reproducibility of the angle for samples at various temperatures.

Furthermore, the contour K of a probehead described herein, generally shows at least one cross-section $S(z3)$ parallel to the xy-plane, for which the width $R(z3)$ in the y-direction is greater or equal to the width in the x-direction (i.e., $R(z3) \geq Q(z3)$). Preferably, $R(z) > Q(z)$ for a large interval of $z<0$. Such a probehead allows significantly more space for installation of gas lines, cylindrical cross section, for the same adjustment range. vacuum lines, electrical lines, and mechanical elements, than a probehead with circular The cross-sections $S(z)$ may have arbitrary shapes, but, circular, oval, elliptical, made up of a plurality of circular sections, rectangular (with or without rounded edges), or shapes made up of straight and circular sections are particularly advantageous, as cross-sections of these shapes provide a great deal of space and are easy to manufacture.

Additionally, a probehead in which the angle of the sample with respect to the probehead can be changed (e.g., to introduce the sample into the probehead and/or eject the sample from the probehead), falls under the scope of the invention, as long as the angle of the rotation axis with respect to the probehead is fixed during the adjustment process of the angle θ, rather than being carried out by an external adjustment mechanism. Since the precision requirements for a tilting mechanism to eject the samples are orders of magnitude lower than the requirements for an adjustment mechanism, it is useful to separate the two functionalities.

In particular for probeheads for SB magnet systems an external adjustment of the angle is preferable for some NMR apparatus (e.g., those which contain wave guides for Dynamic Nuclear Polarization (DNP) measurements, where the RF transmit and receive coils are cooled, or for probeheads for toxic or hazardous substances). This creates significantly more free space in the probehead to place the wave guide, integrate cooling pipes, radiation shields, heat exchangers, and vacuum components. In probeheads for toxic or hazardous substances, the external adjustment allows for more free space to equip contaminated areas with the lowest possible complexity, and in the case of rotor damage, simplify cleaning and/or limit the extent of damage. In this way MAS probeheads may be created for SB magnet systems, which until now have only been available for WB magnet systems. Significantly lower acquisition and operating costs are achieved for the users of these technologies, and a larger range of magnetic field strengths is available.

The deviation of the outer contour of the probehead from the tubular shape known in the prior art provides for an external adjustment mechanism for high intensity magnetic systems with a static field of $B_0 > 20$ T. These systems only exist as SB magnetic systems, which have very long lengths (i.e., L2) in the range of around a meter. Tilting the probehead without reduction of the lateral dimensions in the area of negative z-values would not allow a sufficient adjustment range to balance out the manufacturing tolerances of the magnet system (e.g., the angle of the magnet coil in relation to the magnet dewar, assembly tolerances of the shim systems in relation to the magnet dewar) and the fixed angle position of the rotation axis in relation to the probehead, while at the same time being able to integrate a rotor with a bearing and a drive into the probehead.

The adjustment mechanism of the NMR system may be designed as follows:

The upper connection of the probehead may form a bearing together with a bearing part inside the cavity of the magnet system. Alternatively, the probehead may include an axle that is mounted in the magnet system. In another example, part of the probehead may be designed to be flexible, so that it allows a tilting and/or rotating motion of the probehead. In the case of a bearing shell, the probehead requires a mechanism that tensions the probehead against the bearing shell, and/or positions it at the right height in relation to the bearing shell, enabling an adjustment of the tilt angle without backlash. The angle adjustment itself can be carried out by a linear drive that pushes the lower end of the probehead parallel to the x-axis, as far as possible, relative to the magnet system. At this end, the adjustment mechanism is mechanically coupled to the probehead and the magnet system.

Alternatively, the complete adjustment mechanism may lie outside of the cavity and include a rocker that is attached to the probehead. The rocker defines both the axial position of the probehead and the angle in relation to the magnet system. Such a rocker can be adjusted by, for example, axles and levers, spindles, gear wheels, linear drives and/or hoists. Alternatively, the rocker can comprise a spherical or cylindrical bearing instead of an axle.

One advantage over the prior art is enlarging the dimensions of the probehead with an external adjustment mechanism, in comparison to an adjustment mechanism integrated in the probehead. This leads to a reduction of the required mechanical precision and reproducibility, and therefore reduced manufacturing and maintenance costs.

If a sensor is integrated into the probehead (e.g., to detect the adjusted angle), a non-integrated adjustment mechanism is also a great advantage, as the sensor should not be mounted on a small component with a temperature that varies with the sample temperature. In particular Hall sensors, which are known as angle sensors in the prior art (see, e.g., U.S. Pat. No. 8,203,339 B 2), show a very high sensitivity to temperature variations, as the charge carrier density and the Hall voltage show a strong temperature dependence. With a probehead as described herein, such a Hall sensor can be thermally insulated from the sample temperature and mounted on the probehead, enabling a significantly higher precision angle measurement. A similar principle applies to sensors that determine the angle via optical methods.

A method to operate an NMR-MAS apparatus, with a probehead described herein, is also within the scope of this invention. This method provides an advantage in adjusting the angle of $\theta$ between the rotation axis of the sample and the homogeneous static magnetic field $B_0$ The angle $\theta$ is adjusted by tilting the probehead inserted into the cavity of the magnetic system (either in part or as a whole), at an angle of $\theta$ with $\theta_{target} - \alpha 1 \leq \theta \leq \theta_{target} + \alpha 2$ with respect to the z-axis.

Additionally, the aforementioned and further listed characteristics described herein can be used individually or in combination. The embodiments shown and described should not be seen as an exhaustive list, but are rather exemplary description of the invention.

LIST OF REFERENCE SIGNS AND NAMES (1) Magnetic coil
(2) Room temperature shim system
(3) Dewar
(4) Cavity
(5) Specimen
(6) Wall of cavity
(7) Tilted probehead
(8) Bearing
(9) Bearing part integrated in cavity
(RA) Rotation axis
(DA) Tilt axis
$\theta$ Angle between rotation axis and z-axis
$\theta_m$ Magic angle
SB Standard bore
WB Wide bore
$D_B$ Diameter of bore hole of magnetic system
$\alpha$ Adjustment angle
$\alpha 1$ Maximum negative adjustment angle
$\alpha 2$ Maximum positive adjustment angle
M Set of points, which describe the cavity of the magnetic system
N Set of subsets $O(\alpha)$
$O(\alpha)$ bodies generated through tilting the set M by an angle $\alpha$ around the tilt axis
P Intersection of all subsets of N ($\cap$N)
K Contour of probehead inside the cavity
L1 z-position of the upper end of the probehead inside the cavity
L2 z-position of the lower end of the cavity
S(z) Cross-section to contour K parallel to the xy-plane at z
Q(z) Width of the cross-section S(z) in the x-direction
R(z) Width of the cross-section S(z) in the y-direction
T Cross-section of the contour K with the xz-plane

REFERENCE LIST

[1] U.S. Pat. No. 7,498,812 B 2
[2] US 2014/0099130 A 1
[3] U.S. Pat. No. 7,535,224 B 2
[4] U.S. Pat. No. 5,260,657
[5] U.S. Pat. No. 7,282,919 B 2
[6] U.S. Pat. No. 8,547,099 B 2
[7] U.S. Pat. No. 8,203,339 B 2
[8] "An X 0 shim coil for precise magic-angle adjustment," T. Matsunagaa et al., J. Magn. Res., Vol. 256, 2015, p. 1-8
[9] "A Hall effect angle detector for solid-state NMR," S. Mamonea et al., J. Magn. Res., Vol. 190, 2008, p. 135-141
[10] "Optical lever for monitoring of the magic angle," E. Mihaliuk and T. Gullion, J. Magn. Res., Vol. 223, 2012, p. 46-50.

What is claimed is:

1. A probehead for a Nuclear Magnetic Resonance Magic Angle Spinning (NMR-MAS) apparatus, which is introduced, in operation into a cavity of a magnet system, which generates a homogeneous static magnetic field $B_0$ in a z-direction, wherein the NMR-MAS apparatus is configured to receive a measurement sample in the probehead, which sample has a rotation axis (RA),
wherein the rotation axis RA is tilted at an angle of θ>0 in relation to the z-axis,
wherein the rotation axis RA lies in an xz plane, and wherein the angle θ is adjusted by mechanical tilt around a tilt axis (DA) parallel to the y-axis in the interval $\theta_{target}-\alpha 1 \leq \theta \leq \theta_{target}+\alpha 2$ around a target angle $\theta_{target}$ with the adjustment angles α1, α2, and wherein z=0 is defined as the point of intersection of the rotation axis RA with the z-axis at the adjusted angle $\theta=\theta_{target}$,
wherein the rotation axis RA has an unchangeable, fixed angle towards the probehead,
wherein the NMR-MAS apparatus comprises an adjustment mechanism, which allows at least a portion of the probehead that is inserted into the cavity to be adjusted by an angle α with −α1≤α≤α2 relative to the z-axis, by mechanical rotation around the tilt axis DA
wherein the cavity of the magnet system is an extended body described by a set M of space points, wherein a set N consists of all subsets o(α) and the subsets o(α) are described by rotation around the angle α with −α1≤α≤α2 around the tilt axis DA of the body arising from the set M,
wherein a set P=∩N defines an intersection of all bodies generated by rotation by an angle α with −α1≤α≤α2 of the cavity of the magnet system,
wherein the probehead has an outer contour K, which has an upper end at z=L1 and a lower end at z=−L2 and for which K is a subset of P:K ⊂ P, whereby for all z with −L2 ≤z≤L1 an intersection I(z) of the contour K exists parallel to the xy plane,
wherein the intersection I(0) shows extent width Q(0) in the x-direction, at least one intersection I(z1) with z1<0 exists with a width Q(z1) in the x-direction,
whereby Q(z1)<Q(0),
and at least one intersection I(z2) with z2>0 exists with a width Q(z2) in the x-direction, whereby Q(z2)≤Q(0).

2. The probehead of claim 1, wherein the target angle $\theta_{target}$ is a magic angle $\theta_{target}=\arccos(3^{-0.5})=\theta_m$ with respect to the z-axis.

3. The probehead of claim 1, wherein the outer contour K of the probehead comprises one or more circular cylindrical sections.

4. The probehead of claim 3, wherein the contour K of the probehead is designed such that an intersection T with an xz-plane comprises a straight line at the adjustment angle α for at least one section of the one or more circular cylindrical sections.

5. The probehead of claim 4, wherein the contour K is identical to a contour of a cross-section P for the at least one section, wherein the cross-section P is generated from points defined by rotating the cavity of the magnet system by the adjustment angle α about the tilt axis DA.

6. The probehead of claim 1, wherein the contour K of the probehead comprises sections of cylindrical surfaces or spherical surfaces.

7. The probehead of claim 1, wherein the contour K of the probehead has a cross-section with the xy-plane for at least one z-value, wherein the cross-section with the xy-plane includes at least two sections that are parallel to the x-axis.

8. The probehead of claim 7, wherein the cross-section with the xy-plane of the contour K of the probehead has a width Q(z) at a particular z-value z, and wherein the support frame includes a lower end at z=−L2 and a lower width Qu: =Q(−L2), and wherein the support frame includes an upper end at z=L1 and an upper width of Qo: =Q(L1), and wherein: Qu: =Q(−L2), $Qu \leq Q(z) \forall z > -L2$ and $\exists z$ for which $Qu < Q(z)$ applies and/or $Qo \leq Q(z) \forall z$ with $0 < z < L1$ and $\exists z$ with $-L2 < z < L1$ for which $Qo < Q(z)$ applies and/or $Qu < Q(0)$ and $Qo \leq Q(0)$.

9. The probehead of claim 8, wherein the width Q(z) at the z-value of zero is between 35 millimeters and 45 millimeters.

10. The probehead of claim 1, wherein the adjustment mechanism comprises a bearing within the cavity of the magnet system.

11. The probehead of claim 10, wherein the adjustment mechanism includes a tensioning mechanism that forces the probehead against the bearing, and wherein the adjustment mechanism includes an adjustable spacer at a lower end of the probehead.

12. The probehead of claim 10, wherein the bearing includes a bearing piece integrated into the magnet system and an at least partially cylindrical connection of an upper end of the probehead.

13. The probehead of claim 10, wherein the bearing includes a mechanical axis that is pivotally mounted in the cavity of the magnet system.

14. The probehead of claim 10, wherein the adjustment mechanism includes a rocker coupled to the magnet system.

15. A method for operation of the NMR-MAS apparatus with the probehead of claim 1, wherein the angle θ between the rotation axis RA of the sample holder and the homogeneous static magnetic field $B_0$ is adjusted within the range of $\theta_{target}-\alpha 1 \leq \theta \leq \theta_{target}+\alpha 2$.

16. A Nuclear Magnetic Resonance Magic Angle Spinning (NMR-MAS) apparatus comprising:
a probehead with an outer contour K configured to be inserted into a cavity of a magnet system that generates a homogeneous static magnetic field $B_0$ along a z-axis;
a sample with a rotation axis tilted at an angle θ with respect to the z-axis, wherein the rotation axis is at a fixed angle with respect to the probehead; and
an adjustment mechanism configured to tilt the probehead about a tilt axis parallel to the y-axis, wherein the adjustment mechanism adjusts the angle θ around a target angle $\theta_{target}$ by an adjustment angle α within a range of $\theta_{target}-\alpha 1 \leq \theta \leq \theta_{target}+\alpha 2$.

* * * * *